United States Patent [19]

Buckenmaier et al.

[11] Patent Number: 5,394,024

[45] Date of Patent: Feb. 28, 1995

[54] CIRCUIT FOR ELIMINATING OFF-CHIP TO ON-CHIP CLOCK SKEW

[75] Inventors: Karl C. Buckenmaier, Somerville; Richard M. Strong, Pittsburgh, both of Mass.

[73] Assignee: VLSI Technology, Inc., San Jose, Calif.

[21] Appl. No.: 991,769

[22] Filed: Dec. 17, 1992

[51] Int. Cl.$^6$ ............................ H03K 5/13; H03K 5/14
[52] U.S. Cl. ..................... 327/160; 327/292; 327/237
[58] Field of Search ............... 328/55, 155, 63, 72; 307/269, 262, 603, 602, 605, 606, 595, 597

[56] References Cited

U.S. PATENT DOCUMENTS

| | | | |
|---|---|---|---|
| 4,504,749 | 3/1985 | Yochida | 307/590 |
| 5,095,233 | 3/1992 | Ashby et al. | 307/603 |
| 5,180,937 | 1/1993 | Laird et al. | 328/55 |
| 5,192,886 | 3/1993 | Wetlanfer | 307/602 |
| 5,223,755 | 6/1993 | Richley | 307/603 |
| 5,237,224 | 8/1993 | DeLisle et al. | 307/603 |

OTHER PUBLICATIONS

M. Johnson, et al., *A Variable Delay Line PLL for CPU–Coprocessor Synchronization*, IEEE Journal of Solid State Circuits, vol. 23, No. 5, Oct. 1988, p. 1218.

D. Jeong et al., *Design of PLL–Based Clock Generation circuits*, IEEE Journal of Solid State Circuits, vol. 22, No. 2, Apr. 1987, p. 255.

K. Kohiyama, et al., *A Single–Chip Digital PLL System for TV Image Processing*, ISSCC Digest of Technical Papers, Session 15, Video Signal Processors, Paper FP 15.1, Feb., 1991, p. 248.

*Primary Examiner*—Timothy P. Callahan
*Assistant Examiner*—My-Trang Nu Ton
*Attorney, Agent, or Firm*—Douglas L. Weller

[57] ABSTRACT

A circuit eliminates clock skew between an off-chip clock signal originating off an integrated circuit and an on-chip clock signal produced on the integrated circuit. The on-chip clock signal is produced by phase delaying the off-chip clock signal. A first delay path and a second delay path each phase delay the off-chip clock signal an identical amount. A multiplexor selects one of the delay paths to produce the on-chip clock signal. When phase delay through the first delay path is adjusted, the multiplexor selects the second delay path. When phase delay through the second delay path is adjusted, the selection means selects the first delay path. A phase detector and filter circuit generates control signals which indicate, based on phase difference between the off-chip clock signal and the on-chip clock signal, when to increase and when to decrease the phase delay through the delay paths.

14 Claims, 12 Drawing Sheets

CIRCUIT FOR ELIMINATING OFF-CHIP TO ON-CHIP CLOCK SKEW

BACKGROUND

The present invention concerns a digital circuit which utilizes a phase locked loop to control off-chip to on-chip clock skew.

Within an integrated circuit, delay introduced by capacitance within logic components on the integrated circuit can cause clock skew between a clock signal coming in from off the integrated circuit (off-chip clock) and the clock signal used within the integrated circuit (on-chip clock).

In the prior art, phase locked loop circuits have been used to control off-chip to on-chip clock skew. However, these prior art circuits generally incorporate custom analog circuitry which makes these circuits unsuitable for use in a gate array that provides only digital circuitry. Further, the prior art circuits generally introduce jitter into the clock signal which, although usually acceptable, is not desirable. Also, many of the prior art designs require the use of external components which, while being acceptable, is also not desirable.

For examples of prior art phase locked loop systems, see M. Johnson, et al., *A Variable Delay Line PLL for CPU-Compressor Synchronization*, IEEE Journal of Solid State Circuits, Vol. 23, No. 5, October 1988, p. 1218; D. Jeong et al., *Design of PLL-Based Clock Generation Circuits*, IEEE Journal of Solid State Circuits, Vol. 22, No. 2, April 1987, p. 255; and K. Kohiyama, et al., *A Single-Chip Digital PLL System for TV Image Processing*, ISSCC DIGEST OF TECHNICAL PAPERS, Session 15, Video Signal Processors, Paper FP 15.1, February, 1991, p. 248.

SUMMARY OF THE INVENTION

In accordance with the preferred embodiment of the present invention, a circuit is presented which eliminates clock skew between an off-chip clock signal originating off an integrated circuit and an on-chip clock signal produced on the integrated circuit.

The on-chip clock signal is produced by phase delaying the off-chip clock signal. In the preferred embodiment of the present invention, a first delay path and a second delay path each phase delay the off-chip clock signal an identical amount. A multiplexor selects one of the delay paths to produce the on-chip clock signal. When phase delay through the first delay path is adjusted, the multiplexor selects the second delay path. When phase delay through the second delay path is adjusted, the selection means selects the first delay path. This arrangement eliminates potential glitches in the on-chip clock signal caused by adjusting the phase delay.

Also in the preferred embodiment of the present invention, a counter is used to generate a phase delay value. The phase delay value determines the phase delay through the first delay path and the second delay path. This is done by using each digit of the counter output to control a phase delay element in each of the delay paths. The length of an incremental phase delay through a phase delay element corresponds to the order of magnitude of the counter digit connected to the phase delay element. A controller also is used. The controller causes the counter means, based on the value of control signals, to increment and decrement the phase delay value.

The control signals are generated by a phase detector and filter circuit. The control signals indicate, based on phase difference between the off-chip clock signal and the on-chip clock signal, whether to increment the counter, decrement the counter or hold the current value in the counter.

In the preferred embodiment of the present invention, the phase detector and filter circuit includes a first flip-flop and a second flip flop. The first flip-flop receives the off-chip clock signal on an FF input, is clocked by the on-chip clock signal and produces a first control signal. The second flip-flop receives the off-chip clock signal on an FF input, is clocked by the on-chip clock signal after the on-chip clock signal is slightly phase delayed and for produces a second control signal. The slight phase delaying of the on-chip clock signal before using it to clock the second flip-flop allows for the output of the phase to be stable near the "in phase" point. Filter circuitry is connected to the first flip-flop and the second flip-flop to filter the first control signal and the second control signal to eliminate effects of noise within the on-chip clock signal and the off-chip clock signal.

The present invention is advantageous in that the phase locked loop circuit is a purely digital design which does not require analog circuitry or external components. Also, the circuit minimizes jitter introduced into the clock.

DESCRIPTION OF THE PREFERRED EMBODIMENT

Figure 1:
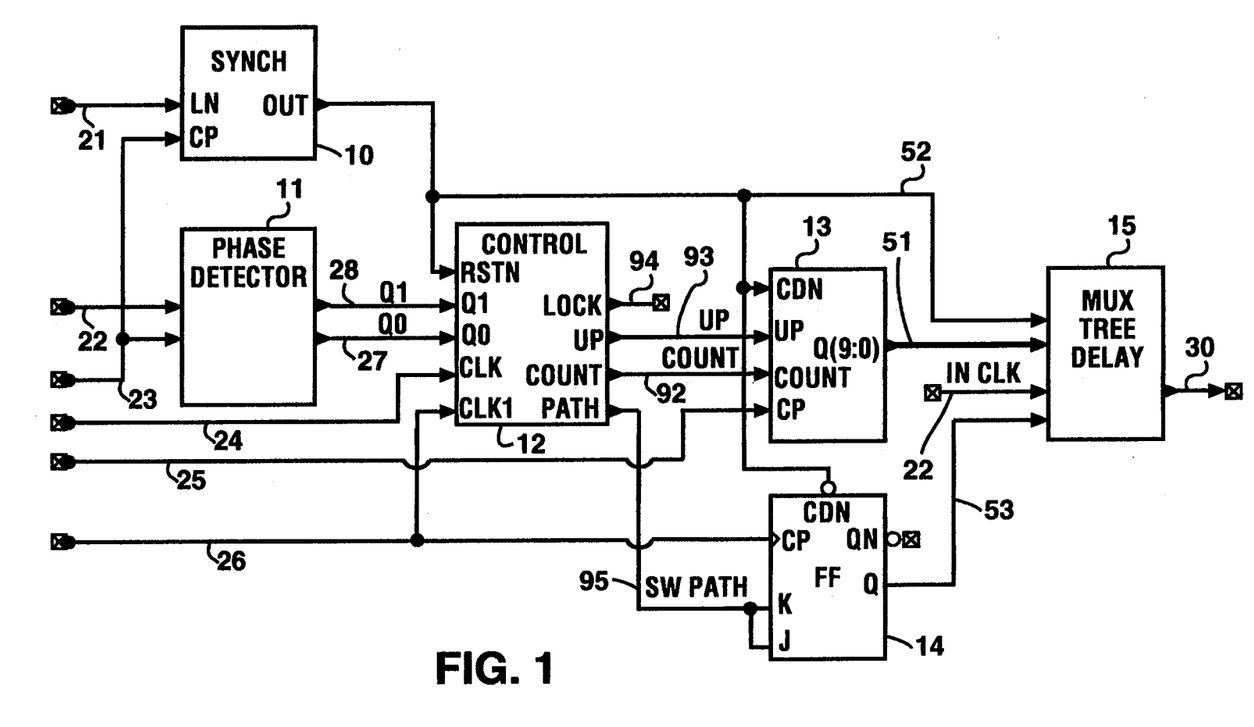
FIG. 1 shows a block diagram of a phase locked loop circuit in accordance with a preferred embodiment of the present invention.

FIG. 1 shows a block diagram of a phase locked loop circuit within an integrated circuit in accordance with a preferred embodiment of the present invention. Inputs to the phase locked loop circuit include a reset signal on a line 21, an external clock signal from off the integrated circuit on a line 22, and an internal feedback clock signal on a line 23, a line 24, a line 25 and a line 26. The internal feedback clock signal is placed on four input lines for buffering purposes. The phase locked loop circuit generates an internal clock signal placed on a line 30. The internal clock signal is phase locked to the external clock signal on line 22. The internal clock signal placed on line 30 is buffered and placed on line 23, line 24, line 25 and line 26. In the present application, the internal clock signal when placed on line 23, line 24, line 25 and line 26 is used for feedback to the phased locked loop circuit and is therefore sometimes referred to herein as the internal feedback clock signal.

Logic circuitry for the phase locked loop circuit is organized into six circuit blocks. These circuit blocks include a synchronization block 10, a phase detector and filter circuit block 11, a control block 12, a bi-directional counter circuit 13, a flip-flop 14, and a multiplexed tree delay circuit 15, connected as shown.

Figure 2:
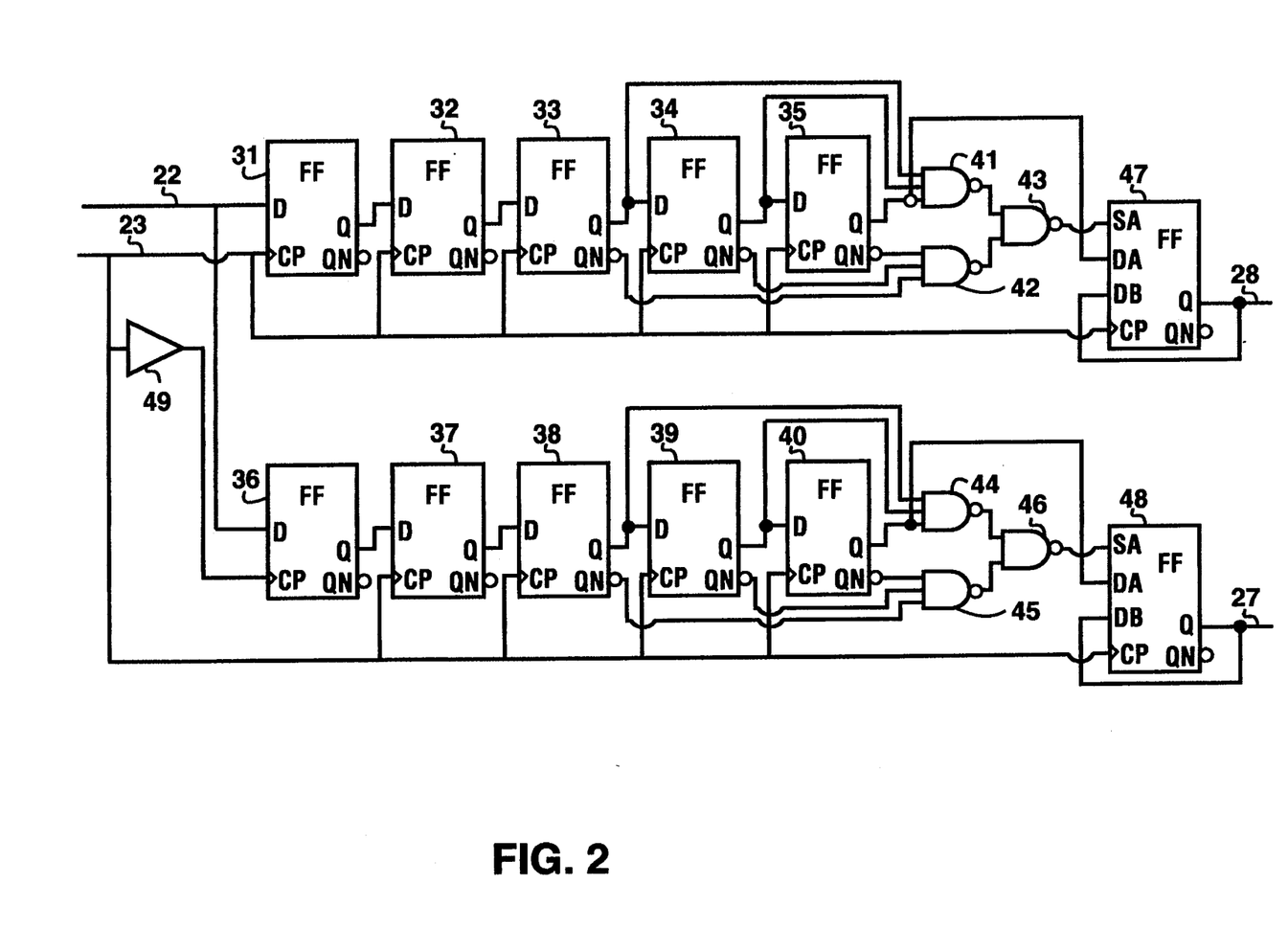
FIG. 2 shows a phase detector and filter circuit which forms part of the phase locked loop circuit shown in FIG. 1, in accordance with the preferred embodiment of the present invention.

FIG. 2 shows phase detector and filter circuit 11. Phase detector and filter circuit 11 includes a D flip-flop 31, a D flip-flop 32, a D flip-flop 33, a D flip-flop 34, a D flip-flop 35, a D flip-flop 36, a D flip-flop 37, a D flip-flop 38, a D flip-flop 39, a D flip-flop 40, a logical NAND gate 41, a logical NAND gate 42, a logical NAND gate 43, a logical NAND gate 44, a logical NAND gate 45, a logical NAND gate 46, a flip-flop 47, a flip-flop 48 and buffer 49 connected as shown.

Flip-flops 31, 32, 36 and 37 form the phase detector portion of the circuit. The external clock signal on line 22 serves as a D input to flip-flops 31 and 36. The internal feedback clock signal on line 23 serves as a clock signal for flip-flops 31 through 35, 37 through 40, 47 and 48. Buffer 49 introduces a slight time delay between the internal feedback clock signal on line 23 before the internal feedback clock signal reaches flip-flop 36. When the clock edge of the feedback clock signal on line 23 is just slightly before the clock edge of the external clock signal on line 22, flip-flop 31 will output a logic 0 and flip-flop 36 will output a logic 1. This is the locked condition.

The remainder of the circuit shown in FIG. 2 acts as a filter to prevent noise on a clock line or within the signal from causing a premature change in the output of phase detector and filter circuit 11. Phase detector and filter circuit 11 generates feedback control signals on a line 27 and a line 28. When the feedback control signal on line 27 is at logic 1 and the feedback control signal on line 28 is at logic 0, the phase delay of the feedback clock signal is not adjusted due to a locked condition. When the feedback control signal on line 27 is at logic 0 and the feedback control signal on line 28 is at logic 0, the phase delay of the feedback clock signal is increased. When the feedback control signal on line 28 is at logic 1 and the feedback control signal on line 27 is at logic 0 or at logic 1, the phase delay of the feedback clock signal is reduced.

Figure 3:
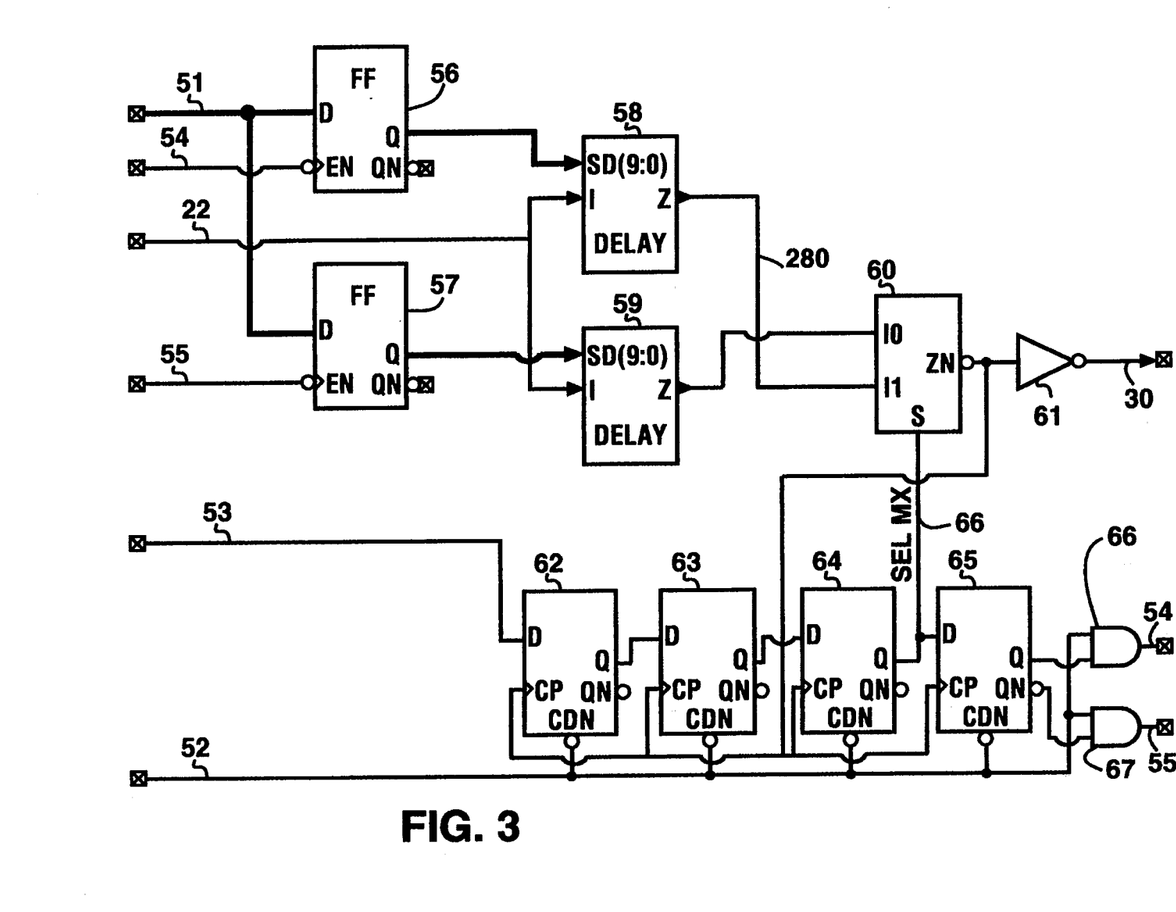
FIG. 3 shows a multiplexed tree delay circuit which forms part of the phase locked loop circuit shown in FIG. 1, in accordance with the preferred embodiment of the present invention.

FIG. 3 shows multiplexed tree delay circuit 15. Multiplexed tree delay circuit 15 generates the internal clock signal on line 30 by phase delaying the external clock on line 22. Ten select delay lines 51 are used to select an amount of delay. The phase delay is provided by a tree delay circuit 58 and a tree delay circuit 59. Tree delay circuit 58 and tree delay circuit 59 are identical in structure. The phase delay through each tree delay circuit is adjusted only when the tree delay is not currently selected. This eliminates glitches in the resulting internal clock signal on line 30 which could occur if the phase delay were adjusted when the tree delay circuit was in use.

Ten select delay signals on lines 51 are stored at the input of a ten bit register 56 and a ten bit register 57. The delay signals held by register 56 are used to select a phase delay amount for tree delay circuit 58. Likewise, the delay signals held by register 57 are used to select a phase delay amount for tree delay circuit 59. A multiplexor 60 selects a clock signal from either tree delay circuit 58 or tree delay circuit 59 to be coupled through an inverter 61 to line 30. A flip-flop 62, a flip flop 63, a flip-flop 64, a flip-flop 65, a logic AND gate 66 and a logic AND gate 67 are used to control selection of the tree delay circuits. The selection control logic is responsive to a reset signal on a reset line 52, and to a select delay tree signal on a line 53. The clock signal for flip-flops 62 through 65 is the output of multiplexor 60. Once new select delay signals are placed on lines 51, and after a settling time of approximately 30 clock cycles, a new select signal is placed on line 53. This new select signal propagates through flip-flops 62 through 64, allowing the new select delay signal values to settle on the inputs of register 56 and register 57 (although the new select delay signal values will only be stored in one of register 56 and register 57. When the select signal reaches a select multiplexor output 66 of flip-flop 64, this causes multiplexor 60 to select a different delay (e.g. switch from delay tree 58 to delay tree 59). After the new select signal propagates through flip-flop 65, an enable signal for the ten bit register for the tree delay circuit which is not selected (e.g. an enable signal on an enable line 54 for register 56 for delay tree 58) is generated. This causes the delay tree which is not selected (e.g. delay tree 58) to change delay in order to conform to the new phase delay length.

After sufficient time is allowed for the signals within the delay tree which is not selected to settle, the select signal placed on line 53 is again inverted. This inverted select signal propagates through flip-flops 62 through 64, allowing the new select delay signal values to settle on the inputs of register 56 and register 57. When the select signal reaches select multiplexor output 66 of flip-flop 64, this causes multiplexor 60 to switch back to the initially selected tree delay (e.g. switch from delay tree 59 back to delay tree 58). After the inverted select signal propagates through flip-flop 65, an enable signal for the ten bit register for the tree delay circuit which is was initially selected (e.g. an enable signal on an enable line 55 for register 57 for delay tree 59) is generated. This causes the delay tree which is not selected (e.g. delay tree 59) to change delay in order to conform to the new phase delay length.

Figure 4:
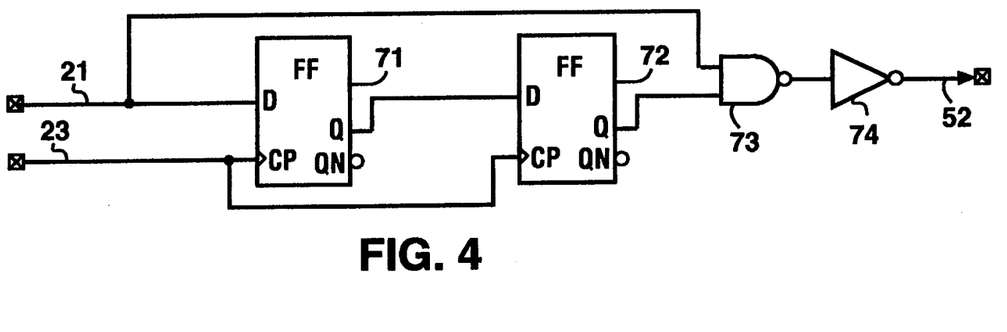
FIG. 4 shows a synchronization circuit which forms part of the phase locked loop circuit shown in FIG. 1, in accordance with the preferred embodiment of the present invention.

FIG. 4 shows an implementation of synchronization block 10. Synchronization block 10 is used to provide synchronization for the reset signal placed on line 21.

Synchronization block 10 includes a flip-flop 71, a flip-flop 72, a logic NAND gate 73 and an inverter 74 connected as shown.

Figure 5:
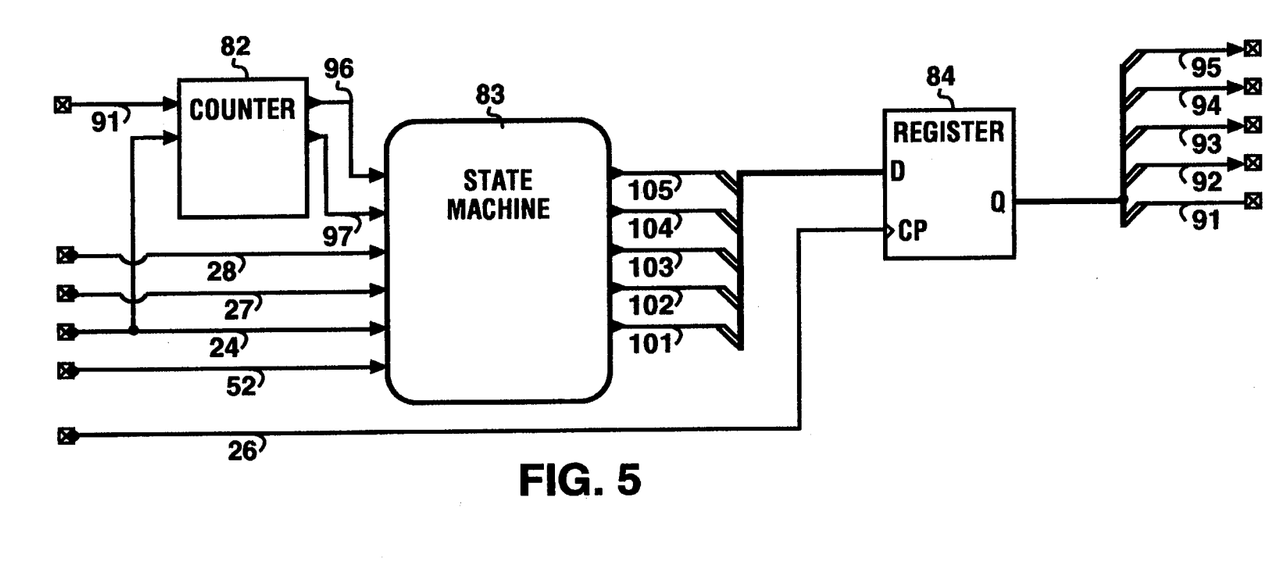
FIG. 5 shows a control circuit which forms part of the phase locked loop circuit shown in FIG. 1, in accordance with the preferred embodiment of the present invention.

FIG. 5 shows a block diagram for control circuit 12. Control circuit 12 includes a counter 82, a state machine 83 and a register 84, connected as shown.

Figure 6:
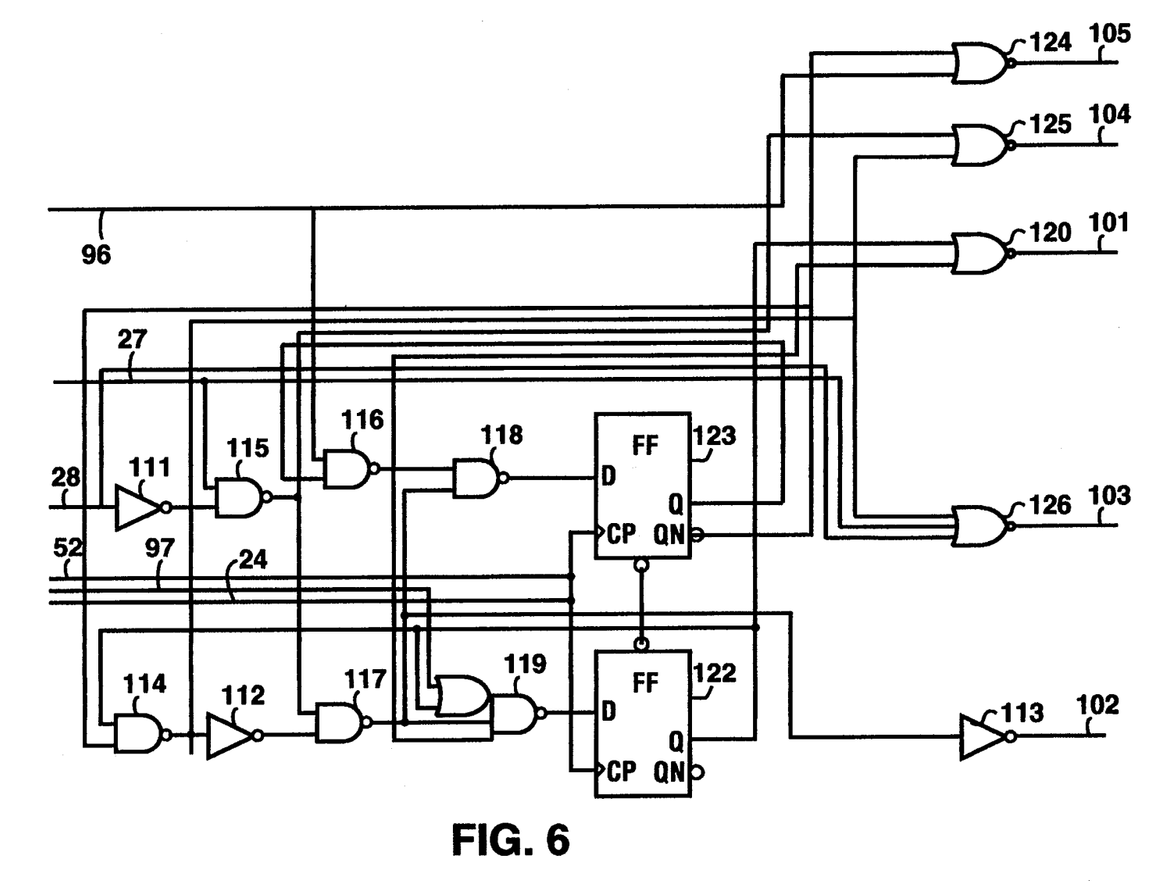
FIG. 6 shows a state machine which forms part of the control circuit shown in FIG. 5, in accordance with the preferred embodiment of the present invention.

FIG. 6 shows a circuit layout for state machine 83. State machine 83 includes an inverter 111, an inverter 112, an inverter 113, a logic NAND gate 114, a logic NAND gate 115, a logic NAND gate 116, a logic NAND gate 117, a logic NAND gate 118, a logic gate 119, a logic NAND gate 120, a D flip-flop 122, a D flip-flop 123, a logic NOR gate 124, a logic NOR gate 125 and an logic NOR gate 126, connected as shown.

State machine receives as input a nogltn signal (nogltn) on a line 96, a ready signal (rdy) on a line 97, a feedback control signal (q1) on line 28, a feedback control signal (q0) on line 27, the internal feedback clock on a line 24 and the reset signal on reset line 52. State machine generates a clear signal (clrn) on a line 101, a count (count) signal on a line 102, a count direction signal (up) on a line 103, a lock indication signal (lock) on a line 104, and a switch delay path signal (swpath) on a line 105.

TABLE 1

```
clock clk;
reset !restn --> EVAL;
inputs q0 q1 nogltn rdyn;
outputs
    count = 0
    up = 0
    sw_path = 0
    lock = 0
    clrn = 1;
state EVAL
{let clrn = 0;
}
    !q1 & q0            --> WAIT2 lock=1
    q1                  --> WAIT1 count=1 up=0,
    !q0 & !q1           --> WAIT1 count=1 up=1;
state WAIT1
    nogltn              --> WAIT1,
    !nogltn             --> WAIT2 sw_path=1 clrn=0;
state WAIT2
    rdyn                --> WAIT2
    !rdyn               --> EVAL
end
```

As shown in FIG. 5, register 84, composed of five D flip-flops arranged in parallel, is clocked by the internal feedback clock signal on line 26. The output of register 84 is the clear signal (clrn) on a line 91, the count (count) signal on a line 92, the count direction signal (up) on a line 93, the lock indication signal (lock) on a line 94 and the switch delay path signal (swpath) on a line 95.

Figure 7:
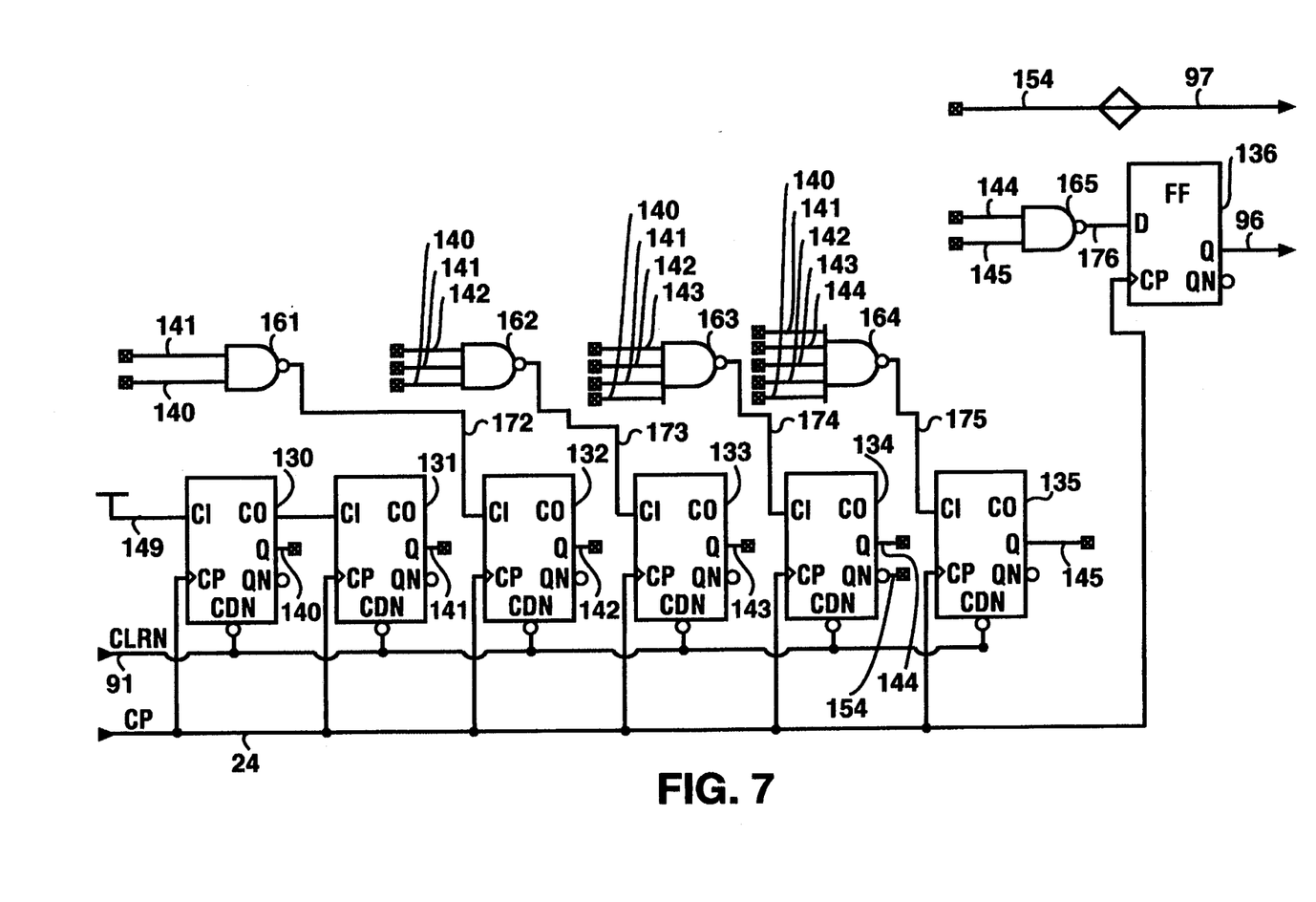
FIG. 7 shows a control counting circuit which forms part of the control circuit shown in FIG. 5, in accordance with the preferred embodiment of the present invention.

FIG. 7 shows a block diagram for counter 82. Counter 82 includes a counter element 130, a counter element 131, a counter element 132, a counter element 133, a counter element 134, a counter element 135. A carry input 149 of counter 130 is held at logic 1. The internal feedback clock on line 24 serves a clock signal for counter 82. A counter output 150 of counter element 130 serves as a carry input of counter element 131.

A logic AND gate 161 combines a Q output 140 of counter element 130 and a Q output 141 of counter element 131 to produce a carry input 172 for counter element 142. A logic AND gate 162 combines a Q output 140 of counter element 130, a Q output 141 of counter element 131 and a Q output 142 of counter element 132 to produce a carry input 173 for counter element 143. A logic AND gate 163 combines a Q output 140 of counter element 130, a Q output 141 of counter element 131, a Q output 142 of counter element 132 and a Q output 143 of counter element 133 to produce a carry input 174 for counter element 144. A logic AND gate 164 combines a Q output 140 of counter element 130, a Q output 141 of counter element 131, a Q output 142 of counter element 132, a Q output 143 of counter element 133 and a Q output 144 of counter element 134 to produce a carry input 175 for counter element 145.

A logic AND gate 165 combines Q output 144 of counter element 134 and a Q output 145 of counter element 135 to produce a D input 172 for a D flip-flop 136. A Q output of D flip-flop 136 produces the nogltn signal (nogltn) on line 96. A QN output 154 of counter element 134 produces the ready signal placed on line 97.

Figure 8:
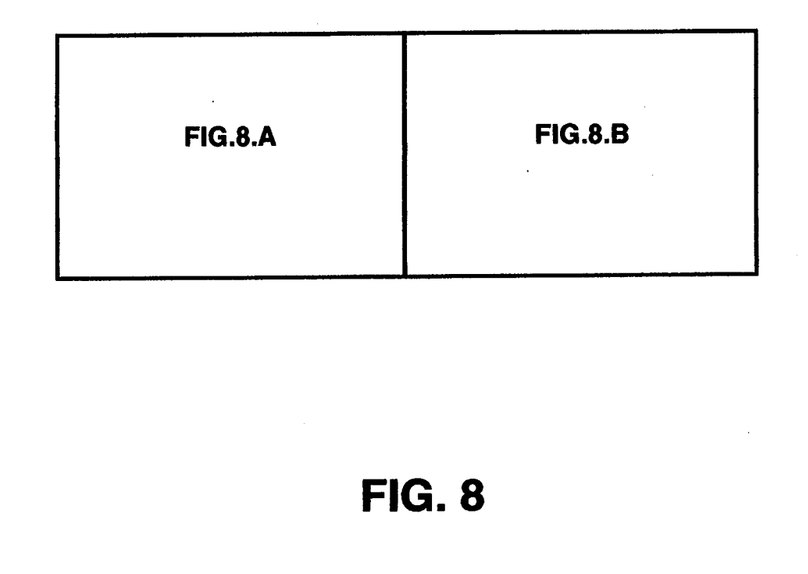
FIG. 8 shows the relationship between FIGS. 8A and 8B which show a counter circuit which forms part of the phase locked loop circuit shown in FIG. 1, in accordance with the preferred embodiment of the present invention.

FIG. 8 shows a block diagram for bi-directional counter circuit 13. Bi-directional counter circuit 13 counts up or down dependent upon the value of the count direction signal on line 93. In bi-directional counter circuit 13, this signal is buffered by a buffer 251. An actual count (either an increment or a decrement) is made in response to the count signal on line 92. In bi-directional counter circuit 13, the count signal is buffered by a buffer 252 and a buffer 253. The internal feedback clock signal on line 25 serves as a clock for bi-directional counter circuit 13.

Bi-directional counter circuit 13 includes a bi-directional counter element 200, a bi-directional counter element 201, a bi-directional counter element 202, a bi-directional counter element 203, a bi-directional counter element 204, a bi-directional counter element 205, a bi-directional counter element 206, a bi-directional counter element 207, a bi-directional counter element 208 and a bi-directional counter element 209.

A Q output 210 of counter element 200 produces a carry up input to bi-directional counter element 201. A QN output 220 of counter element 200 produces a carry down input to bi-directional counter element 201.

A logic AND gate 231 combines Q output 210 of counter element 200 with a Q output 211 of bi-directional counter element 201 to produce a carry up input to bi-directional counter element 202. A logic AND gate 241 combines QN output 220 of counter element 200 with a QN output 221 of bi-directional counter element 201 to produce a carry down input to bi-directional counter element 202.

A logic AND gate 232 combines the output of logic AND gate 231 with a Q output 212 of bi-directional counter element 202 to produce a carry up input to bi-directional counter element 203. A logic AND gate 242 combines the output of logic AND gate 241 with a QN output 222 of bi-directional counter element 202 to produce a carry down input to bi-directional counter element 203.

A logic AND gate 233 combines the output of logic AND gate 232 with a Q output 213 of bi-directional counter element 203 to produce a carry up input to bi-directional counter element 204. A logic AND gate 243 combines the output of logic AND gate 242 with a QN output 223 of bi-directional counter element 203 to produce a carry down input to bi-directional counter element 204.

A logic AND gate 234 combines the output of logic AND gate 233 with a Q output 214 of bi-directional counter element 204 to produce a carry up input to bi-directional counter element 205. A logic AND gate 244 combines the output of logic AND gate 243 with a QN output 224 of bi-directional counter element 204 to produce a carry down input to bi-directional counter element 205.

A logic AND gate 235 combines the output of logic AND gate 234 with a Q output 215 of bi-directional counter element 205 to produce a carry up input to bi-directional counter element 206. A logic AND gate 245 combines the output of logic AND gate 244 with a QN output 225 of bi-directional counter element 205 to produce a carry down input to bi-directional counter element 206.

A logic AND gate 236 combines the output of logic AND gate 235 with a Q output 216 of bi-directional counter element 206 to produce a carry up input to bi-directional counter element 207. A logic AND gate 246 combines the output of logic AND gate 245 with a QN output 226 of bi-directional counter element 206 to produce a carry down input to bi-directional counter element 207.

A logic AND gate 237 combines the output of logic AND gate 236 with a Q output 217 of bi-directional counter element 207 to produce a carry up input to bi-directional counter element 208. A logic AND gate 247 combines the output of logic AND gate 246 with a QN output 227 of bi-directional counter element 207 to produce a carry down input to bi-directional counter element 208.

A logic AND gate 238 combines the output of logic AND gate 237 with a Q output 218 of bi-directional counter element 208 to produce a carry up input to bi-directional counter element 209. A logic AND gate 248 combines the output of logic AND gate 247 with a QN output 228 of bi-directional counter element 208 to produce a carry down input to bi-directional counter element 209. Q output 210, Q output 211, Q output 212, Q output 213, Q output 214, Q output 215, Q output 216, Q output 217, Q output 218 and a Q output 219 form the ten select delay signals on lines 51.

Figure 9:
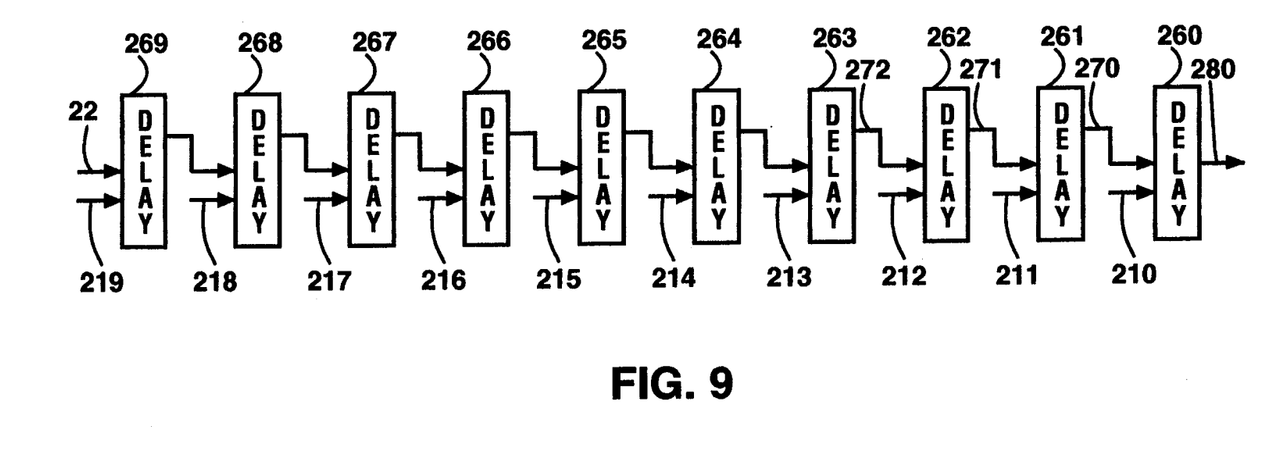
FIG. 9 shows tree delay circuitry which forms part of the multiplexed tree delay circuit shown in FIG. 3, in accordance with the preferred embodiment of the present invention.

FIG. 9 shows a block diagram of tree delay circuit 58. Tree delay 58 includes a phase delay element 260, a phase delay element 261, a phase delay element 262, a phase delay element 263, a phase delay element 264, a phase delay element 265, a phase delay element 266, a phase delay element 267, a phase delay element 268 and a phase delay element 269. Each phase delay element, when selected, adds an incremental phase delay to the external clock signal on line 22. The amount of delay varies for each of phase delay elements 260 through 269. For example, phase delay element 260, when selected, introduces the smallest incremental phase delay while phase delay element 269, when selected, introduces the largest incremental phase delay. Phase delay elements 261 through 268, when selected, introduce intermediate values of incremental phase delay.

Phase delay element 260 is selected by Q output 210 of counter element 200. Phase delay element 261 is selected by Q output 211 of counter element 201. Phase delay element 262 is selected by Q output 212 of counter element 202. Phase delay element 263 is selected by Q output 213 of counter element 203. Phase delay element 264 is selected by Q output 214 of counter element 204. Phase delay element 265 is selected by Q output 215 of counter element 205. Phase delay element 266 is selected by Q output 216 of counter element 206. Phase delay element 267 is selected by Q output 217 of counter element 207. Phase delay element 268 is selected by Q output 218 of counter element 208. Phase delay element 269 is selected by Q output 219 of counter element 209.

The length of an incremental phase delay through a phase delay element corresponds to the order of magnitude of the Q output connected to the phase delay element. Thus, the incremental phase delay through phase delay element 261 is twice the incremental phase delay through phase delay element 260. The incremental phase delay through phase delay element 262 is twice the incremental phase delay through phase delay element 261. And so on.

Figure 10:
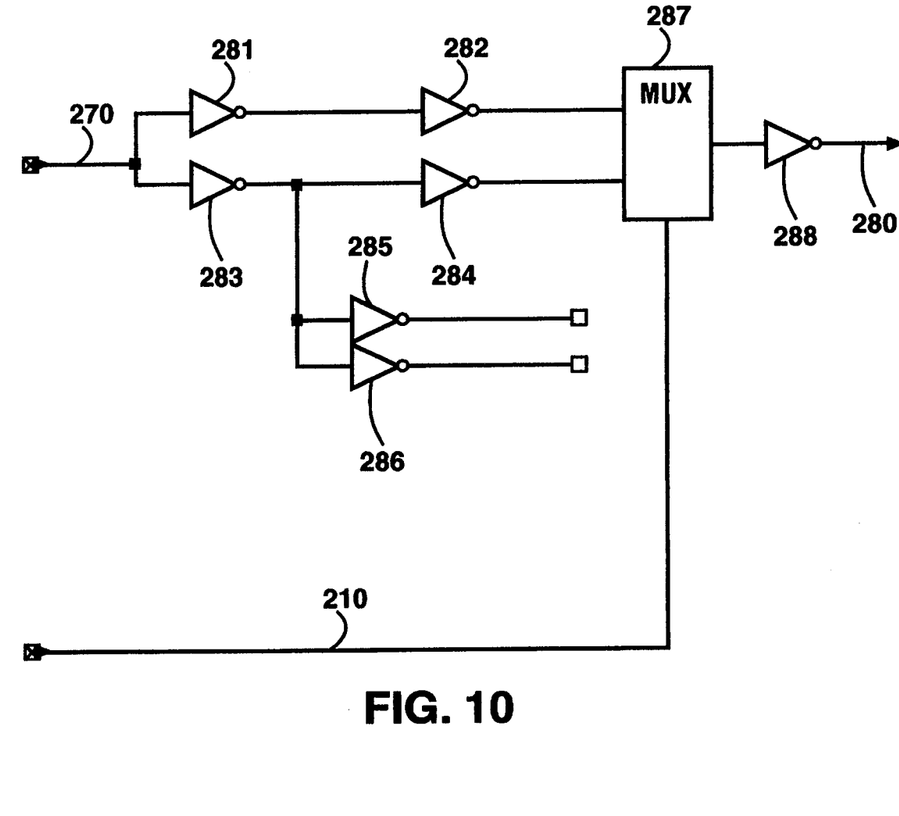
FIG. 10, FIG. 11 and FIG. 12 show detailed information of phase delay elements within the multiplexed tree delay circuit shown in FIG. 9, in accordance with the preferred embodiment of the present invention.

FIG. 10 shows a circuit diagram for phase delay element 260. When Q output 210 does not select phase delay element 260, a multiplexor 287 selects the signal traveling from an input 270 through an inverter 281 and an inverter 282 to be electrically connected through an inverter 288 to a phase delay element output 280. When Q output 210 does select phase delay element 260, multiplexor 287 selects the signal traveling from input 270 through an inverter 283 and an inverter 284 to be electrically connected through inverter 288 to phase delay element output 280. Input capacitance from an inverter 285 and an inverter 286 add the incremental delay when phase delay element 260 is selected. For example, in the preferred embodiment this incremental delay may be approximately 0.25 nanoseconds.

Figure 11:
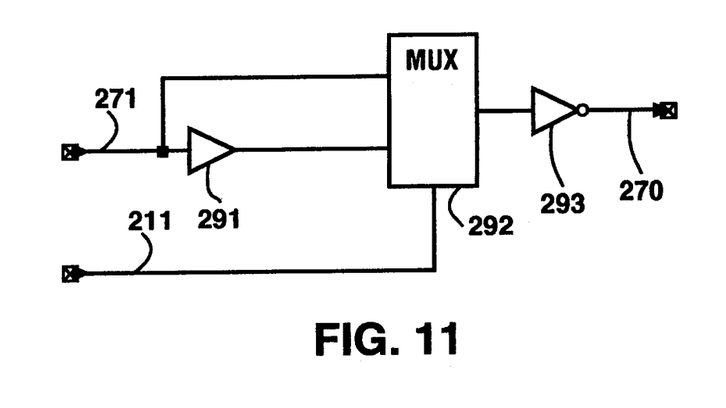

FIG. 11 shows a circuit diagram for phase delay element 261. When Q output 211 does not select phase delay element 261, a multiplexor 292 selects the signal traveling from an input 271 to be electrically connected through an inverter 293 to a phase delay element output 270. When Q output 211 does select phase delay element 261, multiplexor 292 selects the signal traveling from input 271 through buffer 291 to be electrically connected through inverter 293 to phase delay element output 270. Propagation delay through buffer 291 add the incremental delay when phase delay element 261 is selected. For example, in the preferred embodiment this incremental delay may be approximately 0.50 nanoseconds.

Figure 12:
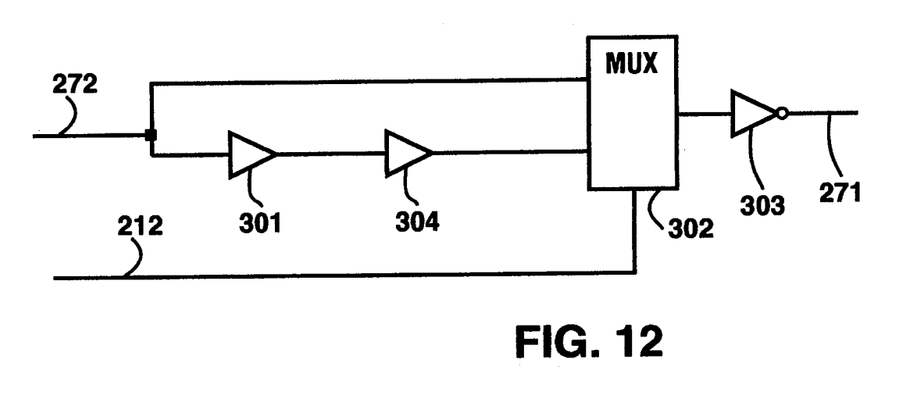

FIG. 12 shows a circuit diagram for phase delay element 262. When Q output 212 does not select phase delay element 262, a multiplexor 302 selects the signal traveling from an input 272 to be electrically connected through an inverter 303 to a phase delay element output 271. When Q output 212 does select phase delay element 262, multiplexor 302 selects the signal traveling from input 272 through buffer 301 and buffer 304 to be electrically connected through inverter 303 to phase delay element output 271. Propagation delay through buffer 301 and buffer 304 add the incremental delay when phase delay element 262 is selected. For example, in the preferred embodiment this delay may be approximately 1.00 nanoseconds.

Phase delay elements 263 through 269 are identical to phase delay element 262, with the addition of buffers connected in series with buffer 301 and buffer 304. The incremental delay through each phase delay when selected is double the incremental delay of the previous phase delay element. Thus, the incremental delay through phase delay element 263, when selected, is double the incremental delay through phase delay element 262, when selected. Likewise, the incremental delay through phase delay element 264, when selected, is double the incremental delay through phase delay element 263, when selected. For example, the incremental delay through phase delay element 263, when selected, is approximately 2.00 nanoseconds. The incremental delay through phase delay element 264, when selected, is approximately 4.00 nanoseconds. The incremental delay through phase delay element 265, when selected, is approximately 8.00 nanoseconds. The incremental delay through phase delay element 266, when selected, is approximately 16.00 nanoseconds. The incremental delay through phase delay element 267, when selected, is approximately 32.00 nanoseconds. The incremental delay through phase delay element 268, when selected, is approximately 64.00 nanoseconds. The incremental delay through phase delay element 269, when selected, is approximately 128.00 nanoseconds.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A circuit on an integrated circuit for eliminating clock skew between an off-chip clock signal originating off the integrated circuit and an on-chip clock signal produced on the integrated circuit, the circuit comprising:

phase delay means for receiving the off-chip clock signal and phase delaying the off-chip-clock signal an amount to produce the on-chip clock signal, the phase delay means including a first delay path for phase delaying the off-chip clock signal the amount of phase delay, phase delay through the first delay path being adjustable, a second delay path for phase delaying the off-chip clock signal the amount of phase delay, phase delay through the second delay path being adjustable, the off-chip clock signal being phased delayed an identical amount at an output of the first delay path as at an output of the second delay path, except when phase delay through the first delay path or through the second delay path is being adjusted, and selection means, coupled to the first delay path and the second delay path for selecting one of the first delay path and the second delay path to produce the on-chip clock signal; and, phase detector means, coupled to the phase delay means, for receiving the off-chip clock signal and the on-chip clock signal and generating control signals which indicate, based on phase difference between the off-chip clock signal and the on-chip clock signal, whether and how to adjust the amount of phase delay by which the first delay path and the second delay path delays the off-chip clock signal to produce the on-chip clock signal;

wherein when phase delay through the first delay path is adjusted, the selection means selects the second delay path and when phase delay through the second delay path is adjusted the selection means selects the first delay path.

2. A circuit as in claim 1 wherein the phase delay means additionally comprises:

counter means, coupled to the first delay path and the second delay path, for generating a phase delay value, the phase delay value determining the phase delay through the first delay path and the second delay path; and, control means coupled to the phase detector means and the counter means for causing the counter means to increment and decrement the phase delay value based on the control signals.

3. A circuit as in claim 2 wherein the first delay path includes a plurality of individual phase delay elements, phase delay through each phase delay element based on the phase delay value.

4. A circuit as in claim 2 wherein, the phase detector means includes a first flip-flop means for receiving the off-chip clock signal on an FF input, for being clocked by the on-chip clock signal and for producing a first control signal; and, a second flip-flop means for receiving the off-chip clock signal on an FF input, for being clocked by the on-chip clock signal after the on-chip clock signal is slightly phase delayed and for producing a second control signal 5. A circuit as in claim 4 wherein the phase detector means additionally includes filter means, coupled to the first flip-flop and the second flip-flop, for filtering the first control signal and the second control signal to eliminate effects of noise within the on-chip clock signal and the off-chip clock signal.

6. A method for eliminating clock skew between an off-chip clock signal originating off the integrated circuit and an on-chip clock signal produced on the integrated circuit, the method comprising the steps of:

(a) receiving the off-chip clock signal and phase delaying the off-chip clock signal an amount to produce the on-chip clock signal including the substeps of:

(a.1) in a first delay path, phase delaying the off-chip clock signal the amount of phase delay, phase delay through the first delay path being adjustable, (a.2) in a second delay path, phase delaying the off-chip clock signal the amount of phase delay, phase delay through the second delay path being adjustable, the off-chip clock signal being phased delayed an identical amount at an output of the first delay path as at an output of the second delay path, except when phase delay through the first delay path or through the second delay path is being adjusted, and (a.3) selecting one of the first delay path and the second delay path to produce the on-chip clock signal including the substeps of selecting the first delay path when phase delay through the second delay path is adjusted and selecting the second delay path when phase delay through the first delay path is adjusted;

(b) generating control signals which indicate, based on phase difference between the off-chip clock signal and the on-chip clock signal, whether and how to change the amount of phase delay by which the phase delay means delays the off-chip clock signal to produce the on-chip clock signal; and, (c) varying the amount of phase delay in step (a) based on the control signals generated in step (b).

7. A method as in claim 6 wherein step (a) additionally comprises the substeps of:

(a.4) generating a phase delay value, the phase delay value determining the phase delay through the first delay path and the second delay path; and, (a.5) incrementing and decrementing the phase delay value based on the control signals.

8. A method as in claim 7 wherein substep (a.1) includes using a first plurality of phase delay elements connected in series to delay the off-chip clock signal, phase delay through each phase delay element being based on the phase delay value and wherein substep (a.2)includes using a second plurality of phase delay elements connected in series to delay the off-chip clock signal, phase delay through each phase delay element being based on the phase delay value.

9. A method as in claim 6 wherein step (b) comprises the substeps of:
- (b.1) producing a first control signal by a first flip-flop, including the substeps of receiving, by the first flip-flop, the off-chip clock signal on an FF input, and clocking the first flip-flop by the on-chip clock signal to produce the first control signal;
- (b.2) slightly delaying the phase of the on-chip clock signal; and,
- (b.3) producing a second control signal by a second flip-flop, including the substeps of receiving, by the second flip-flop, the off-chip clock signal on an FF input, and clocking the second flip-flop, by the on-chip clock signal after the on-chip clock signal is slightly phase delayed in substep (b.2), to produce the second control signal.

10. A method as in claim 9 wherein step (b) additionally includes the substep of filtering the first control signal and the second control signal to eliminate effects of noise within the on-chip clock signal and the off-chip clock signal.

11. A circuit on an integrated circuit for eliminating clock skew between an off-chip clock signal originating off the integrated circuit and an on-chip clock signal produced on the integrated circuit, the circuit comprising:
- phase delay means for receiving the off-chip clock signal and phase delaying the off-chip clock signal an amount to produce the on-chip clock signal, the phase delay means including
  - a first delay path for phase delaying the off-chip clock signal the amount of phase delay, phase delay through the first delay path being adjustable,
  - counter means, coupled to the phase delay means, for generating a phase delay value, the phase delay value determining the phase delay through the first delay path, wherein the counter means generates the phase delay value on a plurality of digit outputs, each digit output representing an order of magnitude of delay, and
  - control means coupled to the phase delay means and the counter means for causing the counter means to increment and decrement the phase delay value based on the control signals;
  - a second delay path for delaying the off-chip clock signal the amount of phase delay, phase delay through the second delay path being adjustable, the off-chip clock signal being phased delayed an identical amount at an output of the first delay path as at an output of the second delay path, except when phase delay through the first delay path or through the second delay path is being adjusted, and
  - selection means, coupled to the first delay path and the second delay path, for selecting one of the first delay path and the second delay path to produce the on-chip clock signal; and,
- phase detector means, coupled to the phase delay means, for receiving the off-chip clock signal and the on-chip clock signal and generating control signals which indicate, based on phase difference between the off-chip clock signal and the on-chip clock signal, whether and how to adjust the amount of phase delay by which the phase delay means delays the off-chip clock signal to produce the on-chip clock signal;
- wherein when phase delay through the first delay path is adjusted, the selection means selects the second delay path and when phase delay through the second delay path is adjusted the selection means selects the first delay path.

12. A circuit as in claim 11 wherein the first delay path includes a plurality of individual phase delay elements connected in series, each individual phase delay element in the plurality of individual phase delay elements connected to a digit output of the counter means, an amount of delay through each individual phase delay element dependent upon a signal value on the digit output to which the individual phase delay element is connected so that when the signal value on the digit output is a first value there is no phase delay through the individual phase delay element and when the signal value on the digit output is a second value there is a phase delay through the individual phase delay element which corresponds to the order of magnitude of delay represented by the digit output to which the individual phase delay element is connected.

13. A method for eliminating clock skew between an off-chip clock signal originating off the integrated circuit and an on-chip clock signal produced on the integrated circuit, the method comprising the steps of:
- (a) receiving the off-chip clock signal and phase delaying the off-chip clock signal an amount to produce the on-chip clock signal including the substeps of
  - (a.1) in a first delay path, phase delaying the off-chip clock signal the amount of phase delay, phase delay through the first delay path being adjustable,
  - (a.2) generating a phase delay value, the phase delay value determining the phase delay through the first delay path, wherein the phase delay value is generated on a plurality of digit outputs, each digit output representing an order of magnitude of delay,
  - (a.3) incrementing and decrementing the phase delay value based on control signals,
  - (a.4) in a second delay path, phase delaying the off-chip clock signal the amount of phase delay, the off-chip clock signal being phased delayed an identical amount at an output of the first delay path as at an output of the second delay path, except when phase delay through the first delay path or through the second delay path is being adjusted, and
  - (a.5) selecting one of the first delay path and the second delay path to produce the on-chip clock signal including the substeps of selecting the first delay path when phase delay through the second delay path is adjusted and selecting the second delay path when phase delay through the first delay path is adjusted;
- (b) generating the control signals based on phase difference between the off-chip clock signal and the on-chip clock signal; and, (c) varying the amount of phase delay in step (a) based on the control signals generated in step (b).

14. A method as in claim 13 wherein substep (a.1) includes using a first plurality of phase delay elements connected in series to delay the off-chip clock signal, each individual phase delay element in the plurality of individual phase delay elements connected to a digit output of the counter means, an amount of delay through each individual phase delay element dependent upon a signal value on the digit output to which the individual phase delay element is connected so that when the signal value on the digit output is a first value there is no phase delay through the individual phase delay element and when the signal value on the digit output is a second value there is a phase delay through the individual phase delay element which corresponds to the order of magnitude of delay represented by the digit output to which the individual phase delay element is connected.

* * * * *